(12) United States Patent
Naum et al.

(10) Patent No.: US 8,124,871 B2
(45) Date of Patent: Feb. 28, 2012

(54) SOLAR CELL AND ITS TRANSPARENT LIGHT CONVERSION FILM

(75) Inventors: Soshchin Naum, Changhua (TW); Wei-Hung Lo, Taipei (TW); Chi-Ruei Tsai, Taipei (TW)

(73) Assignees: Wei-Hung Lo, Taipei (TW); Chen-Pei Hsu, Sanchong (TW)

( * ) Notice: Subject to any disclaimer, the term of this patent is extended or adjusted under 35 U.S.C. 154(b) by 581 days.

(21) Appl. No.: 12/267,636

(22) Filed: Nov. 10, 2008

(65) Prior Publication Data
US 2009/0151786 A1    Jun. 18, 2009

(30) Foreign Application Priority Data
Dec. 12, 2007   (TW) .............................. 96147526 A

(51) Int. Cl.
*H01L 31/00* (2006.01)
*C09K 11/02* (2006.01)
*C09K 11/08* (2006.01)
*C09K 11/77* (2006.01)

(52) U.S. Cl. ................. 136/257; 136/261; 252/301.4 R
(58) Field of Classification Search ................ 136/257, 136/261; 252/310.4 R
See application file for complete search history.

(56) References Cited

U.S. PATENT DOCUMENTS
4,096,387 A * 6/1978 Buckley ................. 250/372
* cited by examiner

*Primary Examiner* — Basia Ridley
*Assistant Examiner* — Allison Bourke
(74) *Attorney, Agent, or Firm* — Muncy, Geissler, Olds & Lowe, PLLC

(57) ABSTRACT

The present invention discloses a solar cell which can enhance the absorption of the short-wavelength range radiation $\lambda<400$ nm of the sun and re-radiate in the wavelength range $\lambda=500\sim780$ nm to enhance the solar cell's capability in absorbing more long-wavelength radiation and form separate electron-hole pairs so as to increase the output power of the solar cell assembly. Furthermore, the present invention also provides a transparent light conversion film for solar cells.

4 Claims, 6 Drawing Sheets

US 8,124,871 B2

SOLAR CELL AND ITS TRANSPARENT LIGHT CONVERSION FILM

FIELD OF THE INVENTION

The present invention relates to a solar cell and its transparent light conversion film, and in particular to a solar cell and its transparent light conversion film which can absorb ultraviolet in the wavelength range λ<400 nm of the sun radiation and re-radiate red light in the wavelength range λ=500~780 nm to reduce the harmful effect of ultraviolet on the solar cell assembly as well as enhance the solar cell's capability in absorbing the radiated red light emitted from the transparent light conversion film so as to increase extra current and enhance the conversion efficiency of the solar cell assembly.

BACKGROUND OF THE INVENTION

The simplest solar cell of using monocrystalline silicon to convert solar radiation into usable energy is described below. The solar cell is based on monocrystalline silicon, usually a p-type semi-conductive monocrystalline silicon wafer, which is realized by doping boron compound into a monocrystalline silicon. Gaseous antimony doped in p-type thin film usually diffuse and form p-n junction on the silicon surface, changing the conducting species from holes into electrons, i.e. an n-type junction. The thickness of n-type deposition on silicon wafer is 0.5-3 µm. The thin film usually connects to a metal electrode (gold or its alloy).The back of the silicon wafer is completely covered with a metal electrode or silver deposited electrode.

Furthermore, the physics principle of solar cell is described below. When the device is activated by the radiation of the sun or artificial light, the photons absorbed by silicon result in unbalanced hole-electron pairs. At this moment, the electrons in the p-layer close to the p-n junction will drift to the boundary and be attracted into the n-type junction by the electric field; on the other hand, the holes carrier (p-type carriers) in the n-type junction on the silicon wafer surface will partially drift into the silicon wafer interior, i.e. the p-type junction. This drifts results in adding extra negative charges into the n-type junction and adding extra positive charges into the p-type junction. Thus the contact potential difference of p-type junction and n-type junction reduces, leading to a voltage in the outside circuit. The semiconductor power source described above has the n-type junction as the cathode and p-type junction as the anode. The effective working efficiency of the simplest framework of the aforementioned solar cell assembly is 15 to 16%.

The photoelectric effect occurring on silicon wafer under light can be described by volt-ampere characteristics equation:

$$U=(KT/q)\times \ln[(I_{ph}-I)/I_S+I_Z]$$

where $I_S$ is the current supplied and $I_{ph}$ is the photoelectric current.

The maximum power from the semiconductor per millimeter square can be written as $I_{ph} \times U = X \times I_{K3} \times U_{XX}$, where X is the proportional constant of volt-ampere characteristics, $I_{K3}$ is the short-circuit current, and $U_{XX}$ is the floating voltage. The effective working efficiency of the simplest solar cell structure described above is 15-16%.

FIG. 1 shows that the basic framework of a conventional solar cell, wherein 1 is a p-type—monocrystalline silicon wafer, 2 is an n-type conductive layer, 3 is an electrode system, and 4 is an outer anti-reflection coating. The silicon wafer of the solar cell is usually covered with dustproof housing made of vinyl acetate or polycarbonate-like compound.

According to the solar radiation spectrum measured in the medium latitude region (at northern latitude 48°, for example), when the sun is 45° above the horizon, the maximum-energy wavelength of the solar spectrum reaching the earth surface is between 290-1060 nm. (It is worth noting that, when a solar cell works in the near-space environment, the complete spectrum also contains the short-wavelength radiation of UV and VUV and the medium-wavelength radiation of far-red longer than 1065 nm; on the other hand, when a solar cell works on the earth surface, the short-wavelength radiation will be absorbed by oxygen in the atmosphere, and the medium-wavelength radiation of UV will be largely absorbed by vapors).

It is also noting that the energy distribution of the solar radiation spectrum is uneven. The maximum energy of the solar radiation appears in the blue light (λ=470 nm). The solar radiation is reduced by 20% in the main section of visible light between the wavelength 500~600 nm, and the corresponding radiation is half at λ=720 nm. Furthermore, the radiation at λ=1000 nm=1 µm is only ⅕ of the maximum value.

FIG. 2 shows the sensitivity of the standard spectral curve of a solar cell sample at each wavelength range corresponding to the solar spectrum. Compared the data of the solar radiation energy spectrum with the data in FIG. 2, it can be found that, at the wavelength range between λ=950~980 nm, the solar cell assembly is most responsive with the maximum sensitivity because of the energy band structure of the monocrystalline silicon; the bandgap width of monocrystalline silicon is Eg=1.21 ev, corresponding to the wavelength of λ=950 nm. On the other hand, the solar cell assembly is virtually irresponsive to the ultraviolet (λ<400 nm), i.e. cannot absorb ultraviolet.

For a long time, researchers and producers have strived to overcome the defects and limitations described above. Chopr disclosed a solution in his article "Thin Film Solar Cells" (pages 378~379, World Publish Ltd.), from which we developed a prototype. FIG. 3 shows a solar cell covered with a layer of monocrystalline ruby, which can enhance the absorption of the solar radiation in the range of 2.3ev~3.2ev. The physical significance of this design is that, by coating a solar cell with a layer of monocrystalline ruby, the absorption of the solar radiation in the range of 2.3ev~3.2ev will be enhanced, and the $Cr^{+3}$ will be activated to induce d-d transitions and then cause the narrow band to emit light. Consequently, the peak wavelength of $Cr^{+3}$ in the ruby corresponds to λ=695 nm, and thus the original solar radiation is moved to longer wavelength range, and the short-wavelength range of the radiation is completely shifted to the wavelength range of λ=700 nm.

In FIG. 3, the plot of photon energy verse absorptivity, the curve 2 is the absorptivity of the activated $Cr^{+3}$, and curve 1 is the light emitting of an activated monocrystalline ruby. FIG. 3 is also marked with the carrier assembly coefficient (curve 3) of a monocrystalline silicon cell coated with an activatable ruby and the coefficient varies with whether the ruby layer is present. It is obvious that the carrier assembly coefficient of the directly-activated short wavelength of the solar radiation is 10~20% higher than that of a light-emitting device operated by a ruby converter. The author of the article thus concluded that the efficiency of a monocrystalline silicon solar cell may still rise by 0.5~2% with a ruby converter. Although some practical improvements have been made in the field of solar cell technology, some drawbacks including the high cost of monocrystalline ruby remain to be improved.

SUMMARY OF THE INVENTION

To overcome the aforementioned drawbacks, the main objective of the present invention is to provide a solar cell and its transparent light conversion film which can absorb ultraviolet in the short wavelength range $\lambda<400$ nm of the sun radiation and re-radiate in the wavelength range $\lambda=500\sim780$ nm.

To improve the aforementioned drawback of the conventional art, the main objective of the present invention is to provide a solar cell and its transparent light conversion film which can enhance the absorption of ultraviolet radiation.

To improve the aforementioned drawback of the conventional art, the main objective of the present invention is to provide a solar cell and its transparent light conversion film which can radiate a spectrum covering a wide wavelength range of energy-intensity $\lambda=500\sim760$ nm, not a narrow band of spectrum.

To improve the aforementioned drawback of the conventional art, the main objective of the present invention is to provide a solar cell and its transparent light conversion film which convert 16% and over of sunlight energy into electric energy.

To achieve the aforementioned objectives, a solar cell according to the present invention comprises: a monocrystalline silicon wafer to hold the transparent light conversion film described later; and a transparent light conversion film which is shaped to be the form of a polymer layer with a transparent fluorescent powder filled therein, is contacted with the outer surface of the monocrystalline silicon wafer, and can enhance the absorption of the short-wavelength radiation ultraviolet $\lambda<400$ nm of the sun and re-radiate in the wavelength range $\lambda=500\sim780$ nm.

To achieve the aforementioned objectives, a solar cell according to the present invention comprises: a monocrystalline silicon wafer to hold the transparent light conversion film described later; and a transparent light conversion film, made by melting phosphor powder and glass and disposed upon the monocrystalline silicon wafer, which can absorb a first specific wavelength range of the sun radiation and re-radiate in the second wavelength range.

To achieve the aforementioned objectives, a solar cell according to the present invention comprises: a monocrystalline silicon wafer; a glass disposed upon the monocrystalline silicon wafer; and a transparent thin layer disposed on the back of the glass, in which a transparent phosphor powder is filled therein and is contacted with the outer surface of the monocrystalline silicon wafer and which can enhance the absorption of the ultraviolet in the short wavelength radiation $\lambda<400$ nm of the sun and re-radiate in the wavelength range $\lambda=500\sim780$ nm.

To achieve the aforementioned objectives, a transparent phosphor powder according to the present invention can enhance the absorption of the short-wavelength radiation $\lambda<400$ nm of the sun and re-radiate in the wavelength range of $\lambda=500\sim780$ nm to enhance the absorption of long-wavelength radiation for the solar cell assembly and in turn form more separate p-n electron-hole pairs.

BRIEF DESCRIPTION OF THE DRAWINGS

The present invention can be more fully understood by reference to the following description and accompanying drawings, in which.

DETAILED DESCRIPTION OF THE PREFERRED EMBODIMENT

Thus far, there has been no experimental data for the highest efficiency of a solar cell approaching that described above. The solar cell based on monocrystalline silicon and light conversion layer can achieve such a high efficiency because the transparent light conversion film is an oxygen-containing polymer with polycarbonate, and/or polysiloxanes, and/or acrylatepolymer as its substrate, which a phosphor powder is filled therein with the filling ratio of the phosphor powder particle in the polymer being 0.1~50%.

When the sunlight reaches the earth, about 6~8% of the energy is ultraviolet. The energy carried by ultraviolet cannot be absorbed by a solar cell to generate electric energy, yet it will degrade and heat up the solar cell assembly, resulting in damaging the assembly and lowering its efficiency. To overcome the aforementioned drawback, the present invention select and produce a transparent phosphor powder which can absorb the ultraviolet in the wavelength $\lambda<400$ nm and re-radiate red light in the wavelength range $\lambda=500\sim780$ nm. the transparent phosphor powder can not only reduce the damaging effect of ultraviolet on the solar cell assembly, but also generate red light, which can be absorbed by the solar cell and in turn generate extra electricity and enhance the conversion efficiency of the solar cell assembly.

Figure 1:
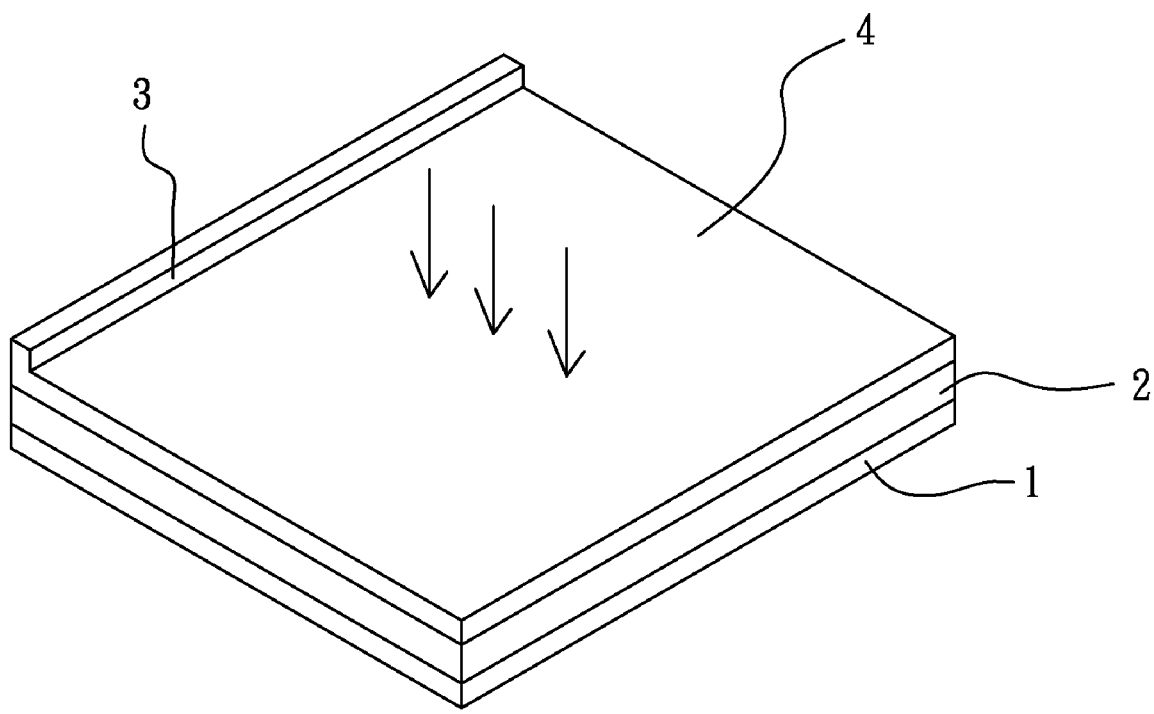
FIG. 1 schematically illustrates the basic framework of a conventional solar cell.
Figure 2:
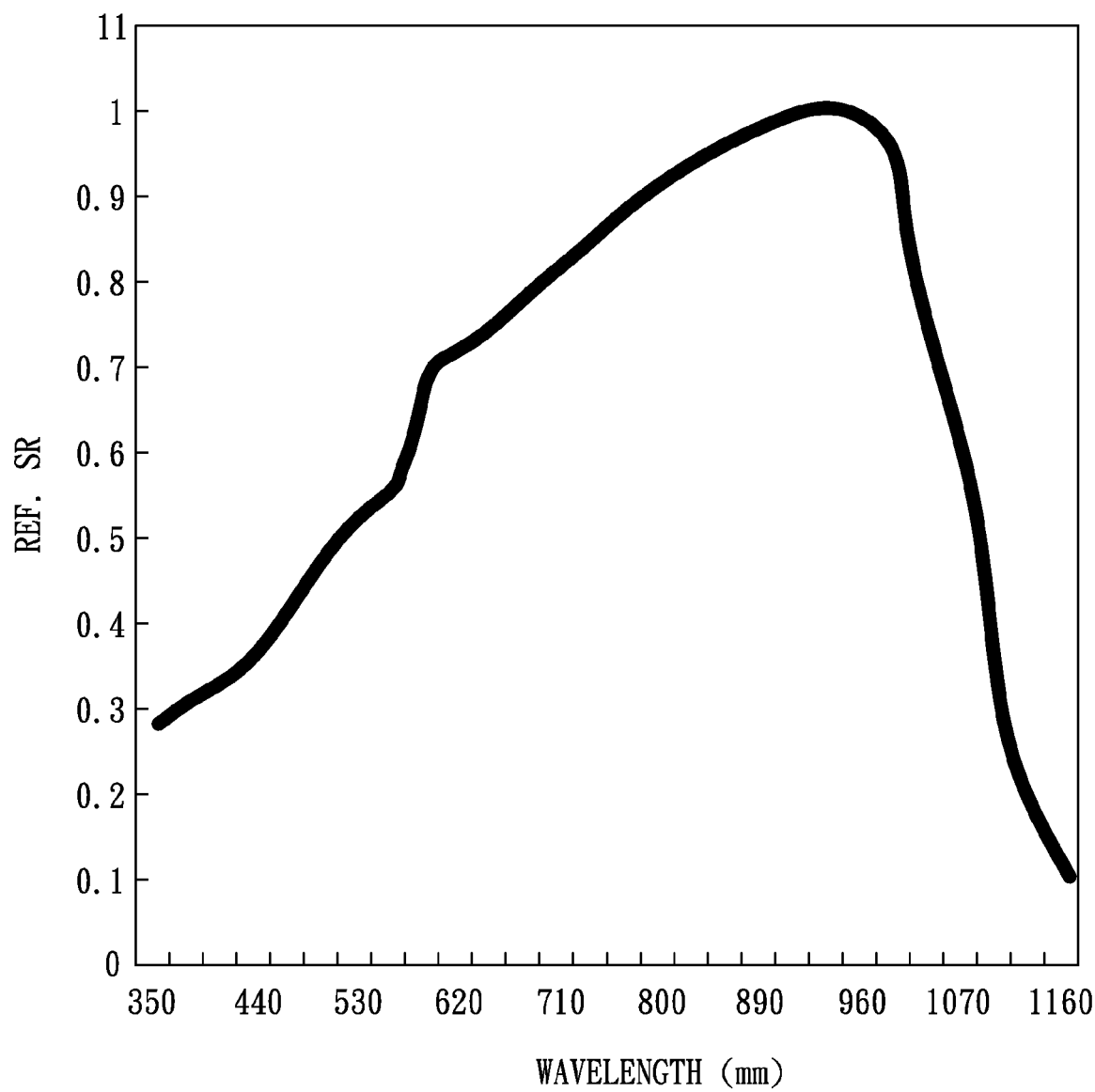
FIG. 2 schematically illustrates the sensitivity of the standard spectral curve of a solar cell sample at each wavelength range corresponding to the solar spectrum.
Figure 3:
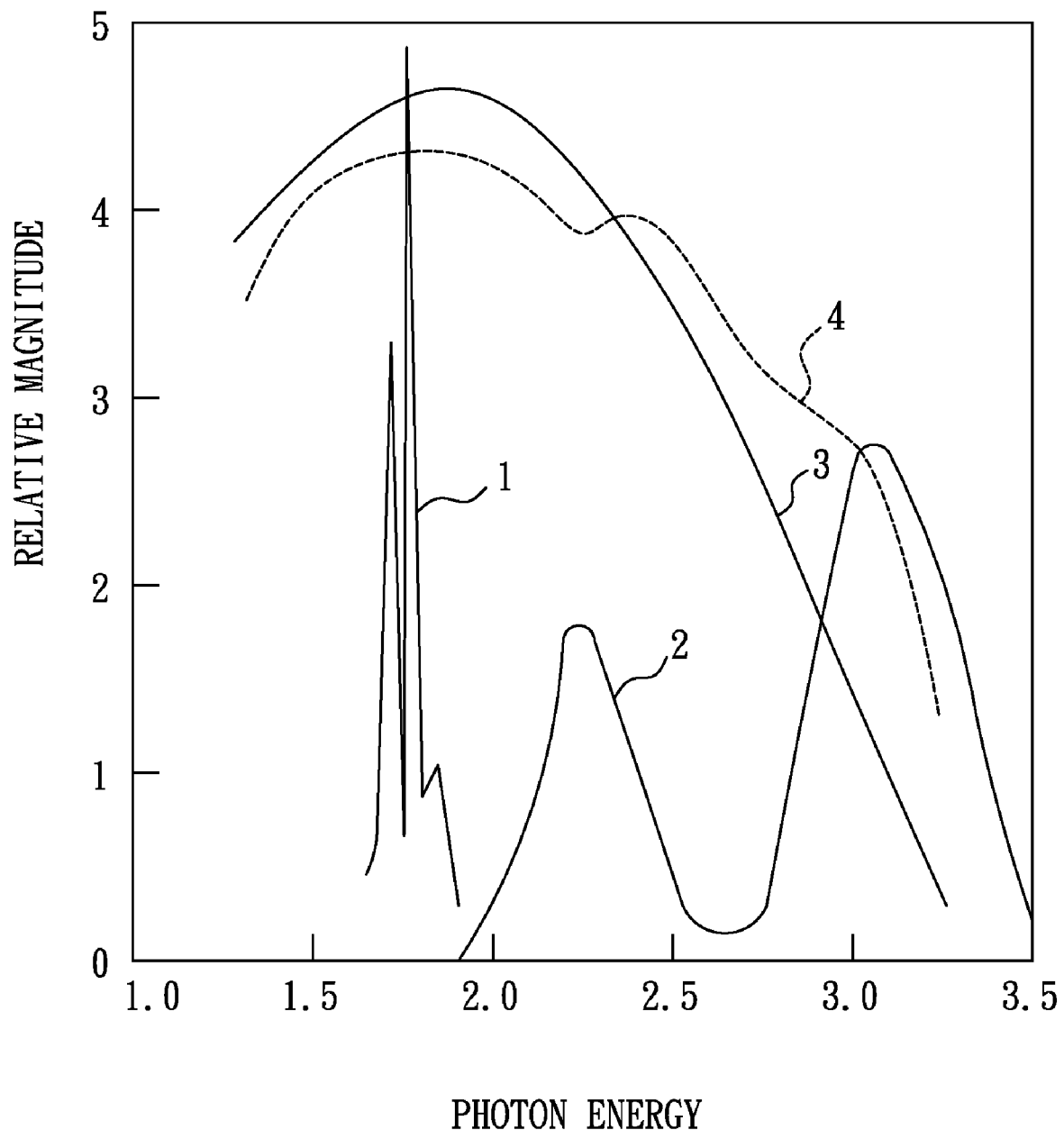
FIG. 3 schematically illustrates a solar cell covered with a layer of monocrystalline ruby, which can enhance the absorption of the solar radiation in the range of 2.3ev~3.2ev.
Figure 4:
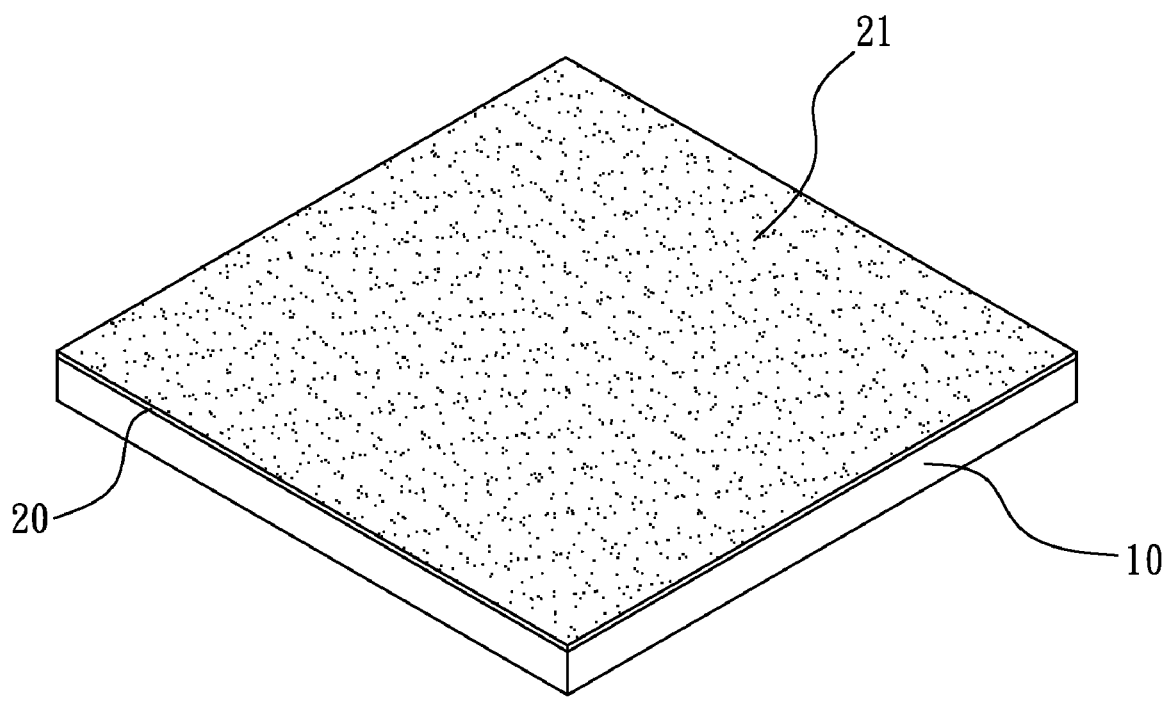
FIG. 4 schematically illustrates the structure of a solar cell according to one preferred embodiment of the present invention.

FIG. 4 illustrates a preferred embodiment of the structure of a solar cell according to the present invention. With reference to FIG. 4, a solar cell according to the present invention comprises a monocrystalline silicon wafer 10 and a transparent light conversion film 20.

Wherein the monocrystalline silicon wafer 10 is, for example but not limited to, a p-type monocrystalline silicon wafer, a p-type polycrystalline silicon wafer, an n-type monocrystalline silicon wafer, or an n-type polycrystalline silicon wafer. In the present embodiment, for example but not limited to, a p-type monocrystalline silicon wafer is selected as an example for explanation. Also, the present solar cell comprises 16~20 silicon wafers no bigger than 120 mm, forming a parallel circuit with a total electric resistance less than 100Ω.

The transparent light conversion film 20 is shaped to be the form of a thin polymer layer, which a transparent phosphor powder 21, for example but not limited to super-dispersion phosphor particle, is filled therein and is contacted with the outer surface of the monocrystalline silicon wafer 10. The transparent phosphor powder 21 can enhance the absorption for a first specific wavelength range of the solar radiation, for example but not limited to, $\lambda<400$ nm, and re-radiate in a second specific wavelength range, for example but not limited to, 500~780 nm, wherein the transparent light conversion film 20 is an oxygen-containing polymer with polycarbonate, and/or polysiloxanes, and/or acrylatepolymer as its substrate. Furthermore, the polymer has a high transmittance in a wide range of wavelength λ=400~1200 nm and its addition percentage is 0.1~50%. The transparent light conversion film 20 may further comprise epoxy (not shown) to enhance its light conversion efficiency.

The chemical composition of the substrate of the phosphor powder 21 is formulated as, for example but not limited to, $(Sr_{1-x}Ba_x)(BO_2)_2$:EuLiCl, where $0 \leqq x \leqq 1$; that Sr and Ba are partial or total substitution can be deduced from the range of x.

The transparent phosphor powder 21 is further added with Eu, Li, or Cl. The addition of Eu is, for example but not limited to, 0.1~15%; Li, 0~15%; and Cl, 0.1~30%. $Sr(OH)_2$, $Ba(OH)_2$, $H_3BO_3$, $Eu_2O_3$, LiOH, $NH_4Cl$ are selected as raw materials and thoroughly mixed in a proper ratio, and the mixture is then fired in a module with different steps. The first step is to raise the temperature to 550~650° C. and remain isothermally for 1 to 2 hours; then in the second step, the temperature is heated up to 1000~1300° C. and remains isothermally for 1 to 3 hours. Finally, the material is cooled naturally to become the transparent phosphor powder 21 according to the present invention.

After the present invention is assembled and exposed to the sunlight, the transparent phosphor powder 21 according to the present invention can absorb ultraviolet in the wavelength range λ<400 nm and re-radiate red light in the wavelength range λ=500~780 nm. The aforementioned absorption and re-radiation can not only reduce the damaging effect of ultraviolet on the monocrystalline silicon wafer 10, but also generate extra electric current and thus enhance the conversion efficiency of the monocrystalline silicon wafer 10 by absorbing the re-radiated red light with the monocrystalline silicon wafer 10. Consequently, the solar cell according to the present invention is advantageous over conventional solar cell assemblies.

Figure 5:
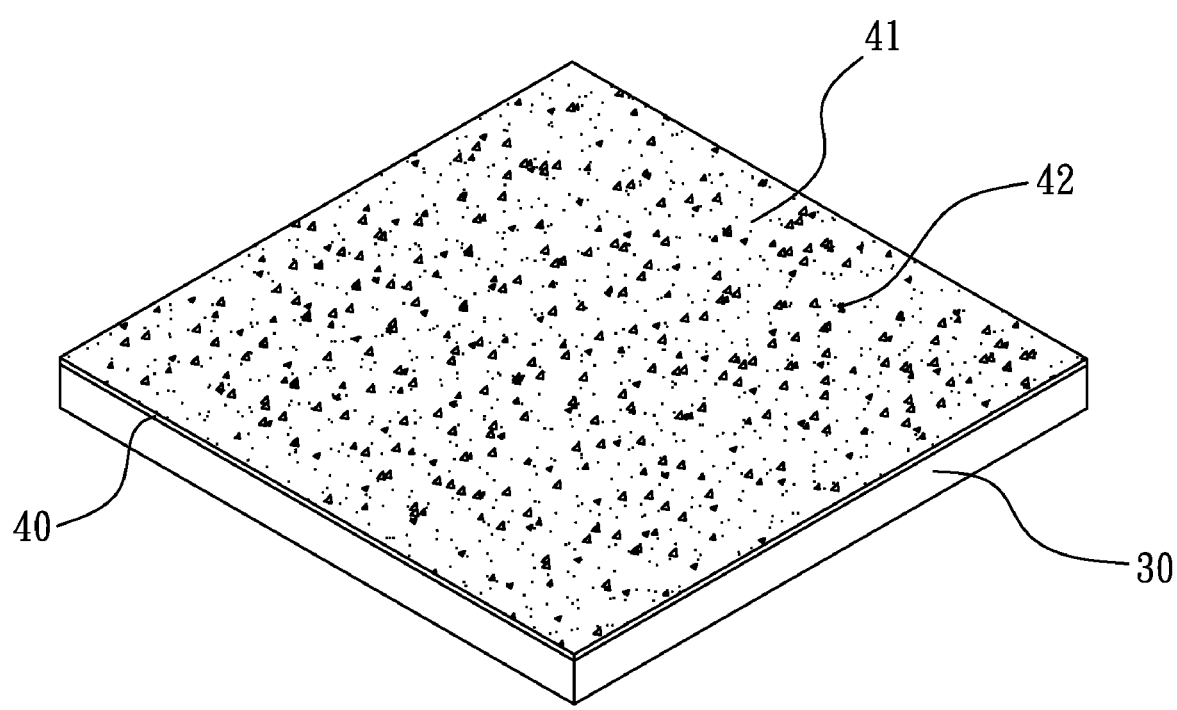
FIG. 5 schematically illustrates the structure of a solar cell according to another preferred embodiment of the present invention.

FIG. 5 illustrates another preferred embodiment of the structure of a solar cell according to the present invention. With reference to FIG. 5, a solar cell according to the present invention comprises a monocrystalline silicon 30 and a transparent light conversion film 40.

Wherein the silicon wafer 30 is, for example but not limited to, a p-type monocrystalline silicon wafer, a p-type polycrystalline silicon wafer, an n-type monocrystalline silicon wafer, or an n-type polycrystalline silicon wafer. In the present embodiment, for example but not limited to, a p-type monocrystalline silicon wafer is selected as an example for explanation. Also, the present solar cell comprises 16~20 silicon wafers no bigger than 120 mm, forming a parallel circuit with a total electric resistance less than 100Ω.

The light conversion film 40 formed by melting a transparent phosphor powder 41 and glass material 42, and disposed upon monocrystalline silicon wafer 30. The light conversion film 40 can enhance the absorption for a first specific wavelength range of the solar radiation, for example but not limited to, λ<400 nm, and re-radiate in a second specific wavelength range, for example but not limited to, 500~780 nm, wherein the melting point of the transparent phosphor powder 41 is about 1000° C. and that of the glass material 42 is also about 1000° C. Consequently, to obtain the glass piece used for the solar cell assembly, the transparent phosphor powder 41 may be added into the glass material 42; they are melted to form a glass piece with transparent phosphor powder, wherein the addition of the transparent phosphor powder 41 is 0.1~75%.

The chemical composition of the substrate of the phosphor powder 41 is formulated as, for example but not limited to, $(Sr_{1-x}Ba_x)(BO_2)_2$:EuLiCl, where $0 \leqq x \leqq 1$; that Sr and Ba are partial or total substitution can be deduced from the range of x, and the principle has been described and will not repeated hereafter.

After the present invention is assembled and exposed to the sunlight, the transparent phosphor powder 41 according to the present invention can absorb ultraviolet in the wavelength range λ<400 nm and re-radiate red light in the wavelength range λ=500~780 nm. The aforementioned absorption and re-radiation can not only reduce the damaging effect of ultraviolet on monocrystalline silicon wafer 30, but also generate extra electric current and thus enhance the conversion efficiency of the monocrystalline silicon wafer 30 by absorbing the re-radiated red light with the monocrystalline silicon wafer 30. Consequently, the solar cell according to the present invention is advantageous over conventional solar cell assemblies.

Figure 6:
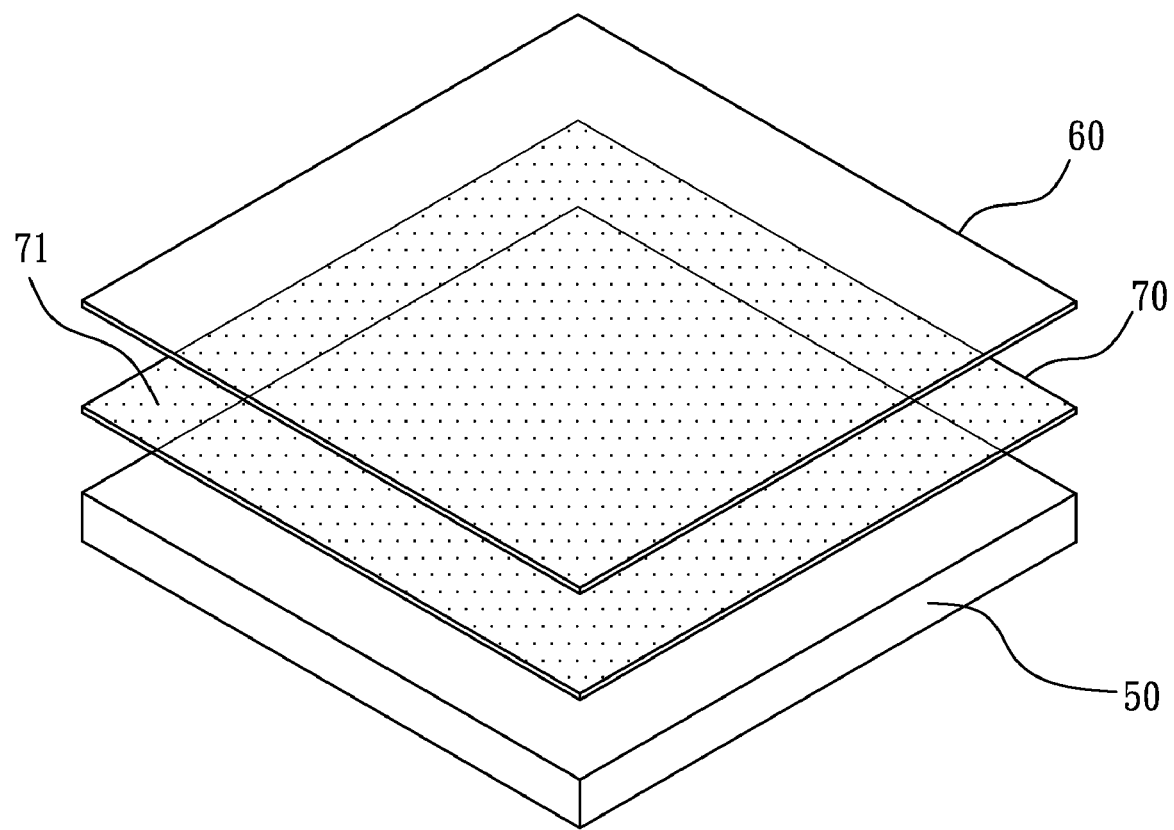
FIG. 6 schematically illustrates the structure of a solar cell according to yet another preferred embodiment of the present invention.

FIG. 6 illustrates another preferred embodiment of the structure of a solar cell according to the present invention. With reference to FIG. 6, a solar cell according to the present invention comprises a monocrystalline silicon 50, a glass piece 60, and a transparent thin layer 70.

Wherein the monocrystalline silicon wafer 50 is, for example but not limited to, a p-type monocrystalline silicon wafer, a p-type polycrystalline silicon wafer, an n-type monocrystalline silicon wafer, or an n-type polycrystalline silicon wafer. In the present embodiment, for example but not limited to, a p-type monocrystalline silicon wafer is selected as an example for explanation. Also, the present solar cell comprises 16~20 silicon wafers no bigger than 120 mm, forming a parallel circuit with a total electric resistance less than 100Ω.

The glass 60 is disposed upon the monocrystalline silicon 50 to protect the monocrystalline silicon 50 and is a conventional art, which will be not discussed furthermore.

The transparent thin layer 70 is disposed on the back of the glass piece 60 and is shaped as a thin plate with a thickness, for example but not limited to, 2 mm. The transparent thin layer 70 is filled with a transparent phosphor powder 71 and is in contact with the outer surface of the monocrystalline silicon wafer 50. The transparent phosphor powder 71 can enhance the absorption for a first specific wavelength range of the solar radiation, for example but not limited to, λ<400 nm, and re-radiate in a second specific range of wavelength, for example but not limited to, 500~780 nm. Also, the transparent thin layer has a light transmittance higher than 85% in the visible light range. Consequently, the transparent phosphor powder 71 will not have a shielding effect, commonly seen in other opaque or semitranslucent phosphor powder, and therefore will not affect its efficiency.

The chemical composition of the substrate of the transparent phosphor powder 71 is formulated as, for example but not limited to, $(Sr_{1-x}Ba_x)(BO_2)_2$:EuLiCl, where $0 \leqq x \leqq 1$; that Sr and Ba are partial or total substitution can be deduced from the range of x, and the principle has been described and will not discussed furthermore.

After the present invention is assembled and the transparent thin layer 70 is exposed to the sunlight, the transparent phosphor powder 71 can absorb ultraviolet in the wavelength range λ<400 nm and re-radiate red light in the wavelength range λ=500~780 nm. The aforementioned absorption and re-radiation can not only reduce the damaging effect of ultraviolet on monocrystalline silicon wafer 50, but also generate extra electric current and thus enhance the conversion efficiency of the monocrystalline silicon wafer 50 by absorbing the re-radiated red light with the monocrystalline silicon wafer 50. Consequently, the solar cell according to the present invention is advantageous over conventional solar cell assemblies.

Furthermore, the present invention discloses a transparent phosphor powder which can absorb ultraviolet in the short-wavelength range $\lambda<400$ nm and re-radiate it in the wavelength range of $\lambda=500\sim780$ nm to enhance the absorption of long wavelength radiation for the solar cell assembly and in turn form more separate p-n electron-hole pairs. Wherein, the chemical composition of the transparent phosphor powder is formulated as $(Sr_{1-x}Ba_x)(BO_2)_2$:EuLiCl, where $0 \leq x \leq 1$. Furthermore, the transparent phosphor powder is further added with Eu, Li, or Cl, and the addition of Eu is, for example but not limited to, 0.1~15%; Li, 0~15%; and Cl, 0.1~30%.

One example process of making the transparent phosphor powder is described as follows: First, the following materials are weighted.

| | |
|---|---|
| $Sr(OH)_2$: 94.9 g | $Eu_2O_3$: 3.52 g |
| $Ba(OH)_2$: 34.3 g | LiOH: 0.24 g |
| $H_3BO_3$: 126.7 g | $NH_4Cl$: 5.35 g |

The materials obtained are then put into a closed container and stirred until they are thoroughly mixed to become raw material. The mixed raw materials is then filled in a 650 ml crucible, which is then placed in a high temperature furnace, and the furnace is heated from room temperature to 600° C. through 5° C./min and isothermally maintained for one hour, and then is heated again to 1050° C. at the same rate and isothermally maintained for two hours, followed by natural cooling down to room temperature.

The fired phosphor powder is ground to fine particles and then is added with 5~8% HCl for acid cleansing followed by clean water washing until neutrality is reached. The powder is then baked in a 120° C. oven and the dried powder is the transparent phosphor powder.

Consequently, a solar cell and its light conversion film according to the present invention can absorb ultraviolet of the sun radiation in the wavelength range $\lambda<400$ nm and re-radiate red light in the wavelength range $\lambda=500\sim780$ nm. Thus, the present invention can not only reduce the damaging effect of ultraviolet on the solar cell assembly, but also generate red light, which can be absorbed by the solar cell and in turn generate extra electricity and enhance the conversion efficiency of the solar cell assembly. Consequently, the present invention can indeed overcome the drawbacks of conventional solar cell.

It is appreciated that although the directional practice device of the present invention is used in a very limited space instead of practicing at the real playing field, effective and steady practice can be obtained as well. Further, it is very easy to set up and to operate the directional practice device of the present invention. These advantages are not possible to achieve with the prior art.

While the invention has been described with reference to the a preferred embodiment thereof, it is to be understood that modifications or variations may be easily made without departing from the spirit of this invention, which is defined by the appended claims.

What is claimed is:

1. A solar cell, comprising:
a silicon wafer; and
a transparent light conversion layer, comprising polymer and a transparent phosphor powder, contacting an outer surface of the silicon wafer, and enhancing the absorption of the ultraviolet in the short wavelength radiation $\lambda<400$ nm of the sun and re-radiate in the wavelength range $\lambda=500\sim780$ nm, wherein the chemical composition of the phosphor powder is formulated as $(Sr_{1-x}Ba_x)(BO_2)_2$:EuLiCl, where $0 \leq x \leq 1$.

2. The solar cell according to claim 1, wherein the silicon wafer is a p-type monocrystalline silicon wafer, a p-type polycrystalline silicon wafer, an n-type monocrystalline silicon wafer, or an n-type polycrystalline silicon wafer.

3. The solar cell according to claim 1, wherein the transparent phosphor powder is super-dispersion transparent phosphor particles.

4. The solar cell according to claim 1, wherein the polymer has a high light transmittance in a wide range of wavelengths $\lambda=400\sim1200$ nm and the transparent phosphor powder is a percentage of the transparent light conversion layer of 0.1~50%.

* * * * *